(12) United States Patent
Hoffmann

(10) Patent No.: US 6,654,591 B1
(45) Date of Patent: Nov. 25, 2003

(54) LOW DISTORTION SIGNAL AMPLIFIER SYSTEM AND METHOD

(75) Inventor: Shlomo Hoffmann, Randolph, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/564,321

(22) Filed: May 3, 2000

(51) Int. Cl.[7] .................................................. H04B 1/04
(52) U.S. Cl. ........................ 455/114; 455/127; 375/297
(58) Field of Search ................................. 455/114, 115, 455/63, 67.3, 253.2, 311, 341, 114.2, 114.1, 114.3, 127; 375/295, 296, 297; 330/49, 149, 151

(56) References Cited

U.S. PATENT DOCUMENTS

| | | | | |
|---|---|---|---|---|
| 4,389,618 A | * | 6/1983 | Bauman ..................... | 330/149 |
| 5,623,227 A | | 4/1997 | Everline et al. ............... | 330/2 |
| 5,831,478 A | | 11/1998 | Long ........................... | 330/52 |
| 5,917,375 A | | 6/1999 | Lisco et al. ................. | 330/149 |
| 5,977,826 A | * | 11/1999 | Behan et al. ............... | 330/149 |
| 6,104,241 A | * | 8/2000 | Cova et al. ................. | 330/149 |
| 6,111,462 A | | 8/2000 | Mucenieks et al. ......... | 330/149 |
| 6,188,732 B1 | * | 2/2001 | Rha ........................... | 330/149 |
| 6,363,120 B1 | * | 3/2002 | Myer et al. ................. | 375/254 |

* cited by examiner

Primary Examiner—Nay Maung
Assistant Examiner—Tan Trinh
(74) Attorney, Agent, or Firm—Julio A. Garceran

(57) ABSTRACT

A signal amplification system independently adjusts the relative phase and/or amplitude between the signal components and/or the relative phase and/or amplitude between the distortion components to improve the combination of corresponding components. For example, a signal amplification system has first and second amplifier paths carrying replicas of signal components. On the first amplifier path, a first amplifier amplifies signal components and generates distortion components. A replica of the amplified signal components and distortion is provided to a coupling path. On the coupling path, the distortion components are isolated by canceling the signal components, and the distortion components are then amplitude and/or phase adjusted without a corresponding adjustment to the phase and/or amplitude of the signal components. The adjusted distortion components are coupled onto the second path where the signal components and the adjusted distortion components are amplified by a second amplifier. The amplified signal components and distortion on the second path are combined with the amplified signal components and distortion on the first path to constructively combine the signal components and destructively combine the distortion components. By independently adjusting the distortion components relative to the signal components, the phase and/or gain adjustments to the distortion and/or signal components can be made which improve the constructive combination of the signal components and/or the destructive combination of the distortion components.

6 Claims, 5 Drawing Sheets

LOW DISTORTION SIGNAL AMPLIFIER SYSTEM AND METHOD

BACKGROUND OF THE INVENTION

1. Field of the Invention

This invention relates to a signal amplification system and, more particularly, to a system and method which enables linear amplification of a signal.

2. Description of Related Art

An ideal power amplifier amplifies an input signal with no waveshape alteration. The ideal power amplifier is therefore characterized as having a transfer function (input signal vs. output signal) which is linear with no transfer function discontinuities. In practice, however, a power amplifier has a transfer function with nonlinear and "linear" regions. Whether the power amplifier is operating in a linear or nonlinear region depends on the amplitude of the input signal. For the power amplifier to achieve as near to linear operation as possible, the power amplifier is designed to operate within its linear region given the range of possible input signal amplitudes. If the input signal has an amplitude which causes the power amplifier to operate outside the linear region, the power amplifier introduces nonlinear components or distortion to the signal. When the input signal possesses peak amplitudes which cause the amplifier to compress, to saturate (no appreciable increase in output amplitude with an increase in input amplitude) or to shut-off (no appreciable decrease in output amplitude with a decrease in input amplitude), the amplifier is being overdriven, and the output signal is clipped or distorted in a nonlinear fashion. Generally, an amplifier is characterized as having a clipping threshold, and input signals having amplitudes beyond the clipping threshold are clipped at the amplifier output. In addition to distorting the signal, the clipping or nonlinear distortion of the input signal generates spectral regrowth or adjacent channel power (ACP) that can interfere with an adjacent frequency.

Various linearization methods are used to enable the use of more cost-effective and more power efficient amplifiers while maintaining an acceptable level of linearity. Feed-forward correction is routinely deployed in modern amplifiers to improve the linearity of the main amplifier with various input patterns. The essence of the feed-forward correction is to sample the main amplifier output, isolate the distortion components generated from the main amplifier on a feed forward path by canceling the main signal components from the feed forward path. The distortion components are provided to a linear correction amplifier on the feed forward path which amplifies the distortion components. The distortion components on the feed forward path are maintained at 180 degrees out of phase to the distortion components on the main signal path and are combined with the distortion components on the main signal path. As the combined distortion components are 180 degrees out of phase, the distortion components cancel without affecting the main signal, thus providing a linear signal at the feed forward amplifier output.

Another linearization technique involves splitting a signal to be amplified by separate amplifiers of the same gain and power performance, and the amplified signal components are constructively combined at the output while the distortion components are used to cancel each other. FIG. 1 shows an amplifier circuit for amplifying an input signal $S_{in}$ to produce an amplified output signal $S_{out}$. The input signal $S_{in}$ can include CDMA or TDMA modulated RF carrier signals having respective fundamental frequencies f1 and f2. Both frequencies or signal components f1 and f2 can lie within standard wireless frequency bands in the 800–960 MHz vicinity. The various signals are shown in a vectorial fashion to conveniently illustrate phase relationships between the same frequency components at various points within the circuit 10. Thus a vector pointing in an upwards direction represents a frequency component of the opposite phase as the same frequency component represented by a downwardly pointing vector.

Input signal $S_{in}$ is applied to input port 12 of a first coupler or power splitter 14 which splits signal into signal S1 at a coupled path output port 16 and a signal S2 at a direct path output port 18. The coupler 14 is preferably a passive device which may be a conventional branch line coupler or Wilkinson type divider that splits input power unequally between the two output ports, preferably with higher power being provided at port 18. For example, the signal level of signal S2 may be 10 dB higher than that of the signal S1. In this embodiment, the frequency signal components f1 and f2 produced on the direct path port 18 are delayed by a 90 degree phase shift while the frequency signal components on the coupled path port 16 have a 0 degree phase shift or no phase shift. Signal S1 contains only the frequency signal components f1 and f2 and is applied to a first amplifier 20 (A1) where it is amplified to produce an amplified signal S3 at the amplifier output. The amplifier 20 (A1) can be a conventional high frequency amplifier operating in class A, AB or B with power gain on the order of 30 dB to produce RF output power of 50 Watts, for example.

As is well known in the art, when a dual or multi-tone signal is applied to an amplifier, which is not perfectly linear, IMD products are generated at predictable frequencies. These IMD products are particularly apparent when the amplifier is being operated in saturation or in the gain compression region of the amplifier. The further into the gain compression region the amplifier is operated, the higher will be the IMD product levels. In addition, amplifiers which operate in class AB or class B modes tend to produce high IMD product levels when multi-frequency input signals are amplified. IMD product levels on the order of −30 dBc (30 decibels below the fundamental frequency or carrier level) are typical. Amplified signal S3 contains amplified frequency signal components f1 and f2 as well as undesirable intermodulation distortion (IMD) products or distortion components at frequencies f3 and f4, where f3 is typically a lower frequency than f1 and f4 is a higher frequency than f2. The frequency signal components f1 and f2 of the signal S3 are designated as having a zero degree phase shift, and the distortion components f3 and f4 are also designated as having a zero degree phase shift in brackets.

The amplified signal S3 is applied to input port 22 of coupler 24, which may be a conventional hybrid (e.g. branch line), backward firing or parallel-line coupler with a coupling value C22. In this case, coupled path signal S4 on output coupling port 26 will be 30 dB below the level of the direct path signal S8 emanating from direct port 25. The voltage levels of the frequency components of the signal S4 are each C22 times the corresponding voltage levels of the S3 frequency components. The voltage levels of the S8 are the square root of $\sqrt{1-C_{22}^2}$ times the corresponding voltage levels of the S3 frequency components. The phases of the frequency components of S4 will be equal to the corresponding ones of S8. When a branch line or other hybrid coupler is used for the coupler 24, then the signals S4 and S8 will differ in phase by 90 degrees. In this embodiment, the coupler 24 produces the signal S8 from the direct port 25 with the frequency components f1–f4 phase shifted by 90 degrees as designated by the −90 degrees and the −90 degrees in brackets. The phases of the frequency components f1–f4 of coupled path signal S4 from the coupling port 26 remain at 0 degrees.

Coupled path signal S4 is then applied to an attenuator 27 and a phase shifter 28. The attenuator 27 and the phase shifter 28 are designed to adjust the amplitude and phase of the signal S4 at each of the frequencies f1–f4. The amplitude of the frequency signal components f1 and f2 of the resulting signal S5 is adjusted to be smaller in amplitude than the frequency signal components f1 and f2 of a signal S6. The signal S6 flows into coupler 29 and is essentially signal S2 delayed by delay line DelayA. The phase shifter 28 adjusts the phase of the frequency components f1–f4 to be 180 degrees out of phase with the corresponding frequency components of S6 within the coupler 29. The coupler 29 receives the signals S5 and S6 and is designed to combine the signal S5 and the signal S6 to provide signal S7 which has frequency components f1-f4. Due to the combination of S5 and S6, the voltage levels of the f1 and f2 signal components of the signal S7 will be equal in amplitude to the f1 and f2 signal components of the signal S1 at the input to the first amplifier 20, and the frequency distortion components f3 and f4 are 180 degrees out of phase with the resulting frequency signal components f1 and f2. In this example, the coupler 29 provides a 90 degree phase shift to the frequency signal components f1 and f2 of S6 and combines the frequency signal components f1 and f2 with a cumulative 180 degree phase shift with the frequency components f1–f4 of the signal S5 with a 0 degree phase to produce the signal S7. The signal S7 has the f1 and f2 signal components with phase values (−180 degrees) equal to the phase values of the respective f1 and f2 signal components of signal S6 (−90 degrees) delayed by 90 degrees (−90−90=−180 degrees), and the frequency distortion components f3 and f4 have phase values (0 degrees) equal to the phase value of the respective f3 and f4 distortion components of signal S5 (0 degrees).

The signal components f1 and f2 of the signal S7 have phase values of −180 degrees, and the distortion components f3 and f4 of the signal S7 have phase values of 0 degrees. The corresponding frequency signal components of signal S8 produced from the direct path port 25 have phase values of −90 degrees, as well as the corresponding frequency distortion components of S8 which also have phase values of −90 degrees. The signal S7 is applied to an attenuator 32 and a phase shifter 34. The attenuator 32 and the phase shifter 34 are designed to adjust the amplitude and phase of the signal S7 of the frequencies f1–f4 prior to being amplified by a second amplifier (A2) 36. In this embodiment, the amplitude of the frequency signal components f1 and f2 of the signal S7 corresponds to the amplitude of the f1 and f2 signal components of the signal S1. The amplifier 36 amplifies the signal S7 to produce a signal S9 with a gain corresponding to the gain provided by the amplifier 20. In amplifying the signal S7, the amplifier 36 produces IMD products at the frequencies f3 and f4 which are in phase with the signal components f1 and f2. As such, the signal components f1 and f2 are amplified with phase values at −180 degrees producing distortion components f3 and f4 also with phase values of −180 degrees. The amplifier 36 also amplifies the distortion components f3 and f4 of the signal S7 which have phase values of 0 degrees. Because the amplified and newly produced distortion components at f3 and f4 are 180 degrees out of phase, the distortion components combine to reduce the amplitude of the distortion components at f3 and f4. In this embodiment, the distortion components with phase values at 0 degrees remain along with the amplified signal components f1 and f2 as the signal S9.

The signal S9 with signal components f1 and f2 with phase values at −180 degrees and distortion components f3 and f4 at 0 degrees is provided to a coupler 38 which combines the signal S9 with a signal S10 to produce the output signal $S_{out}$. The signal S10 is essentially the signal S8 delayed by delay line (DelayB) 40 with frequency components at f1–f4 which have phase values of −90 degrees. In this example, the coupler 38 delays the phase of the frequency components f1–f4 of the signal S10 by 90 degrees and combines the signal S10 with the signal S9. The signal components f1 and f2 of the signals S9 and S10 constructively combine because the signal components at f1 and f2 combine in phase, for example with phase values at −180 degrees. The distortion components f3 and f4 of the signals S9 and S10 destructively combine to reduce the amplitude of the distortion components at f3 and f4 because the distortion components f3 and f4 of S9 (with phase values at 0 degrees) are 180 degrees out of phase with the corresponding distortion components of S10 (with phase values at −180 degrees).

To provide improved combination of the signal S9 with a signal S10 at the coupler 38, the amplitude of the frequency components f1–f4 of the signal S7 are adjusted prior to the amplifier 36 such that the amplitudes of the frequency components f1–f4 of the signal S9 are substantially equal to the amplitude of the corresponding components of the signal S10. The attenuator 32 can adjust the amplitude of the frequency components f1–f4 of the signal S7 prior to the amplifier 36. The phase shifter 34 adjusts the phase of the frequency components f1–f4 of the signal S7 such that the signal components f1 and f2 of the signal S9 are in phase with the corresponding signal components of the signal S10 within the coupler 38. In doing so, the distortion components f3 and f4 of the signal S9 should be 180 degrees out of phase with the corresponding distortion components of the signal S10 within the coupler 38 such that the distortion components f3 and f4 are reduced.

To provide acceptable operation of the above amplifier architecture, the attenuation and phase control variables must be maintained in balance. An alignment procedure is necessary to be employed in the lab or production line to find the proper setting for each variable. The resulting settings are saved and stored in an on-board memory or look-up table and used to set the phase and attenuation control variables for proper operation. The amplifier architecture can have difficulty in achieving linearization because the adjustments in the phase and/or amplitude are performed on both the signal components f1 and f2 and the distortion components f3 and f4. A conflict can arise because the amplitude and/or phase settings for improved cancellation of the distortion components is not necessarily the amplitude and/or phase settings for the improved combination of the signal components.

SUMMARY OF THE INVENTION

The present invention involves independently adjusting the relative phase and/or amplitude between the signal components and/or the relative phase and/or amplitude between the distortion components to improve the combination of corresponding components. For example, a signal amplification system has first and second amplifier paths carrying replicas of signal components. On the first amplifier path, a first amplifier amplifies signal components and generates distortion components. A replica of the amplified signal components and distortion is provided to a coupling path. On the coupling path, the distortion components are isolated by canceling the signal components, and the distortion components are then amplitude and/or phase adjusted without a corresponding adjustment to the phase and/or amplitude of the signal components. The adjusted distortion components are coupled onto the second path where the signal components and the adjusted distortion components are amplified by a second amplifier. The amplified signal components and distortion on the second path are combined with the amplified signal components and distortion on the first path to constructively combine the signal components and destructively combine the distortion components. By independently adjusting the distortion components relative to the signal components, the phase and/or gain adjustments to the distortion and/or signal components can be made which improve the constructive combination of the signal components and/or the destructive combination of the distortion components.

BRIEF DESCRIPTION OF THE DRAWINGS

Other aspects and advantages of the present invention may become apparent upon reading, the following detailed description and upon reference to the drawings in which.

DETAILED DESCRIPTION

Illustrative embodiments of a power:amplifier scheme according to the principles of the present invention are described below in which the phase and/or amplitude of the distortion components is adjusted independent of the phase and/or gain adjustments to the signal components to improve the combination of corresponding distortion components. In the embodiments described below, independently adjusted refers to at least one phase and/or gain adjustment made to the distortion component without a corresponding gain and/or phase adjustment to the signal component. Independent adjustment can further refer to at least one gain and/or phase adjustments made to distortion components, the signal components or both that adjusts (changes or maintains) the gain and/or phase relationship between the signal components and the distortion components. In addition to the at least one independent adjustment, phase and/or gain adjustments can be made which effect both signal components and the distortion components. By having independent phase and/or gain (amplitude) adjustments of the distortion components and/or the signal components, independent control or alignment of the combining distortion components and of the combining signal components can be achieved, thereby leading to improved performance of the destructive combination of the distortion components and/or the constructive combination of the signal components.

Figure 1:
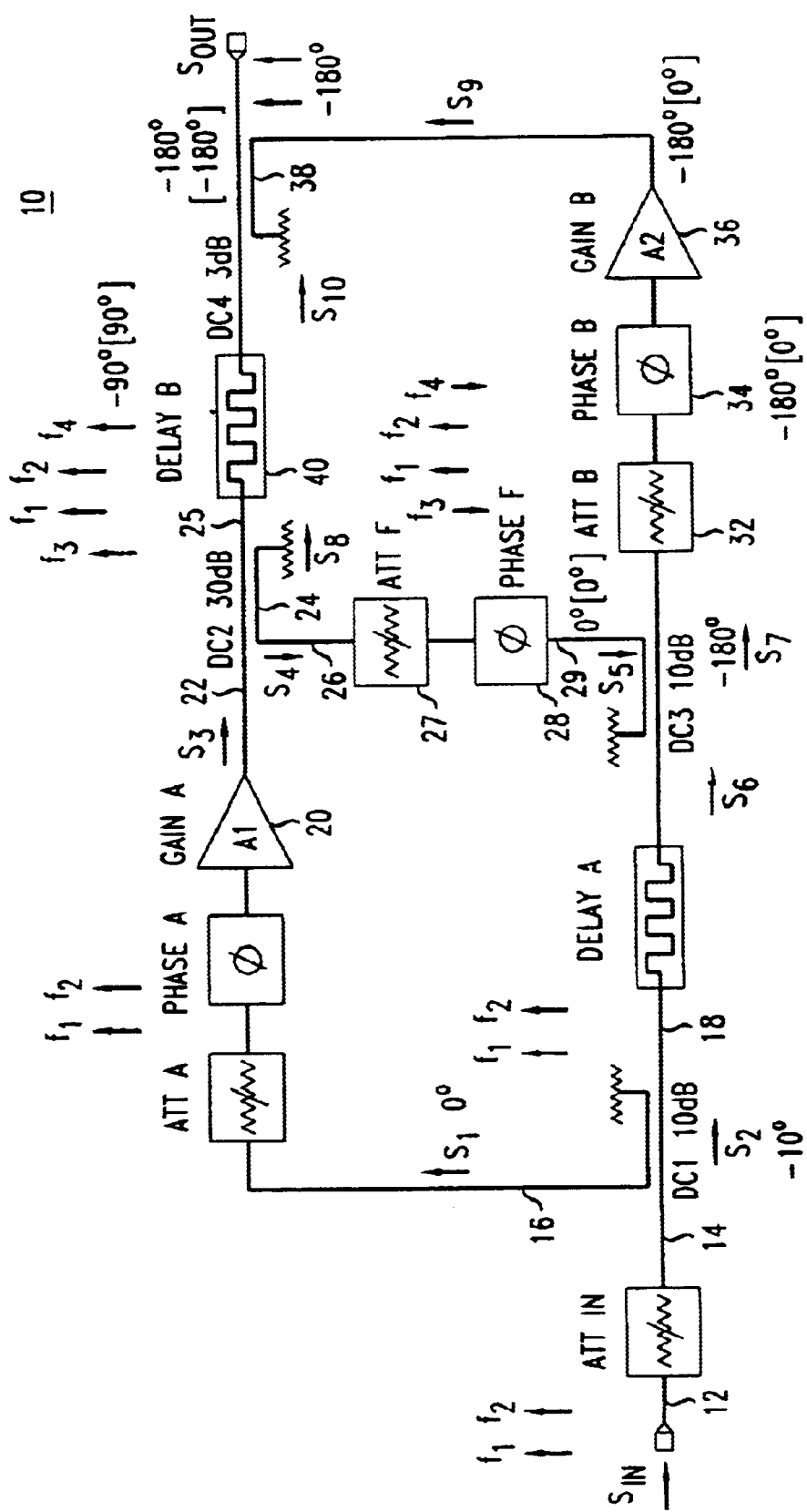
FIG. 1 shows an amplification system of the prior art.
Figure 2:
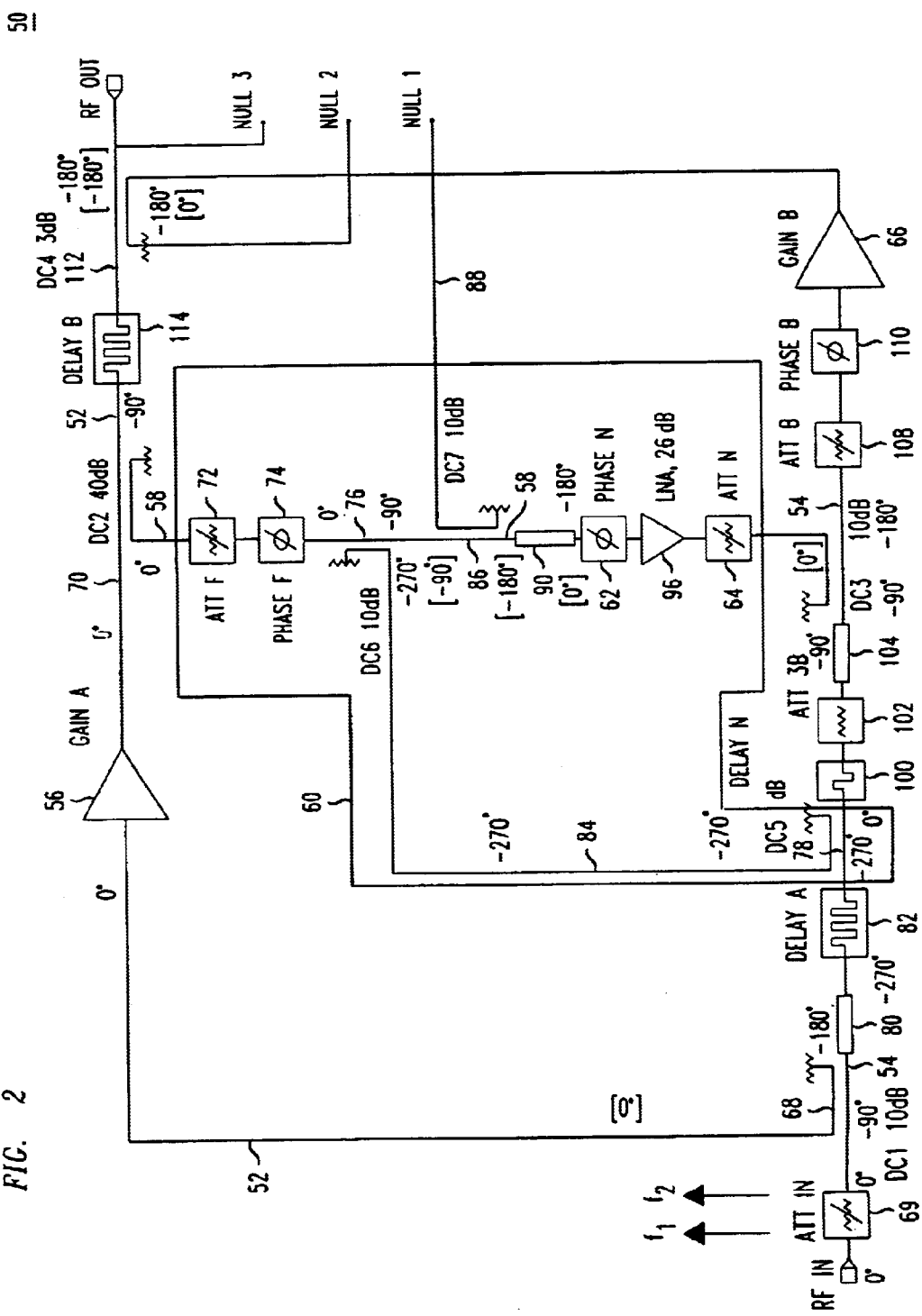
FIG. 2 shows an embodiment of an amplification system according to the principles of the present invention.

FIG. 2 shows a general block diagram of an amplifier architecture or system 50 having a first amplifier path 52 and a second amplifier path 54 carrying replicas of signal components. On the first amplifier path 54, a first amplifier 56 amplifies signal components and generates distortion components. A replica of the amplified signal components and distortion is provided to a coupling path 58. An independent adjustment arrangement 60 receives the distortion components from the coupling path 58 and the signal components from the second path 54 to independently adjust the phase and/or gain of at least one of the signal components and the distortion components which adjusts the gain and/or phase relationship between the signal components and the distortion components. In this embodiment, the independent adjustment arrangement 60 isolates the distortion components on the coupling path 58 by combining signal components from the second path 54 and the signal components on the coupling path 58 which are about 180 degrees out of phase and substantially equal in amplitude and thus canceled. The distortion components are amplitude and/or phase adjusted by a phase shifter 62 and an attenuator 64. Because the signal components have been substantially removed from the coupling path 58, the phase and/or gain adjustments to the distortion components are made without a corresponding adjustment to the phase and/or amplitude of the signal components.

The adjusted distortion components are coupled onto the second path 54 where the signal components and the adjusted distortion components are amplified by a second amplifier 66. The amplified signal components and distortion components on the second path 54 are combined with the amplified signal components and distortion components on the first path 52 to constructively combine the signal components and destructively combine the distortion components. By independently adjusting the distortion components relative to the signal components, the phase and/or gain relationship between the signal components and the distortion components becomes independent. Thus, phase and/or gain adjustments to the distortion and signal components can be made which improve both the constructive combination of the signal components and the destructive combination of the distortion components.

In the operation of the embodiment of the amplifier system 50, a coupler 68, such as a 10 dB coupler, receives the signal $RF_{in}$ and couples replicas of the signal $RF_{in}$ onto the first amplifier path 52 and the second amplifier path 54 after an initial amplitude adjustment of $RF_{in}$ by an attenuator 69 (AttIn). The coupler 68 provides the signal components on the first path 52 with 0 degrees phase shift and 10 dB of attenuation, and the signal components are provided to the second path 54 with little attenuation and 90 degree of phase shift delay. The amplifier 56 amplifies the signal components on the first path 52 by Gain A to produce the amplified signal components along with distortion components generated by the amplifier 56 with 0 degrees of relative phase shift. A coupler 70, such as a 40 dB directional coupler, couples the signal components and the distortion components onto the first path 52 and the coupling path 58. Using a 40 dB coupler, the signal components and the distortion components are coupled onto the coupling path with 40 dB of attenuation with no phase shift. The signal components and the distortion components remaining on the first path 52 are delayed by a phase shift of 90 degrees with little attenuation to a phase value of −90 degrees.

On the coupling path 58, the signal components with the distortion components are received by the independent adjustment arrangement 60. The signal components with the distortion components are amplitude-adjusted by an attenuator (AttF) 72 and phase-adjusted by a phase shifter 74 to provide improved cancellation of the signal components at a coupler 76 to isolate the distortion components on the coupling path 58. A coupler 78, such as a 3 dB coupler, on the second path 54 receives the replica of the signal components $RF_{in}$ from the coupler 68 which have been additionally phase-delayed by 180 degrees by a 180 degree phase delay 80 and have been delayed by a delay 82 (Delay A). Accordingly, the coupler 78 provides a replica of the signal components $RF_{in}$ which have been phase shifted by −270 degrees and attenuated by 3 dB onto a cancellation path 84. On the second path 54, the coupler 78 provides a replica of the signal components which are phase shifted by an additional 90 degrees to a phase value of 0 degrees (−270−90=−360=0 degrees) with little attenuation.

The signal components on the cancellation path 84 are provided to the coupler 76, such as a 10 dB coupler which attenuates the signal components on the cancellation path 84 by 10 dB. The coupler 76 destructively combines the replica of the amplified signal components with distortion components with the signal components on the cancellation path 84 to substantially cancel the signal components on the coupling path 58. Canceled or isolated can mean that the signal components are attenuated enough such that the distortion components are the predominant components on the coupling path 58, for example the signal components are 10 dB below the distortion components. The signal components (−270 degrees phase shift) on the cancellation path 84 substantially cancel the signal components received from the coupling path 58 because the signal components are 180 degrees out of phase and have substantially the same amplitude as the signal components from the coupling path 58 which are phase-delayed by 90 degrees in the coupler 76. The DelayA 82 delays the signal components on the cancellation path 84 such that the corresponding portions of the signal components on the cancellation path 84 reach the coupler 76 at substantially the same time as the signal components on the coupling path 58 from the first path 52. Thus, the coupler 76 produces the distortion components and any remaining signal components on the coupling path with a −90 degree phase shift.

A coupler 86 couples off a replica of any remaining signal components and the distortion components onto a measurement path 88 to monitor the cancellation of the signal components. The components coupled by the coupler 86 from the coupling path 58 from the output of the coupler 76 ate attenuated by 10 dB. In response to the components on the measurement path 88, the gain and/or phase adjustments provided by the attenuator 72 and the phase shifter 74 can be set to improve cancellation of the signal components. In this embodiment, the coupler 86 is a 10 dB directional coupler which phase-delays the distortion components from the coupler 76 by another 90 degrees such that the distortion components have phase values of −180 degrees. By monitoring the signal components on the path 88, the adjustments provided by the gain adjuster 72 and/or phase adjuster 74 can be set once, periodically (based on changing conditions or expiration of a time period), or dynamically (based on changing operating conditions or continuously) as described below.

The distortion components isolated on the coupling path 58 are then provided to a 180 degree phase delay 90 in this embodiment, thereby giving the distortion components on the coupling path a phase value of 0 degrees (−180−180=−360=0 degrees). The phase shifter 62 provides a phase adjustment to the distortion components which is not provided to the signal components which have been substantially canceled, reduced or removed from the coupling path 58. In this embodiment, an amplifier 96, such as a low noise amplifier, amplifies the distortion components on the coupling path 58 by 26 dB. The attenuator 64 provides an amplitude adjustment to the distortion components which is not provided to the signal components which have been removed from the coupling path 58. As such, the distortion components are phase and/or amplitude-adjusted independent of the signal components which have been substantially canceled, reduced or removed from the coupling path prior to the distortion components being combined with signal components on the second path 54. By independently. phase and/or amplitude-adjusting the distortion components on the coupling path 58, the destructive combination of the corresponding distortion components at the output of the amplifier architecture 50 can be independently controlled and improved.

In this embodiment, in addition to making the relative gain and/or phase adjustments between the distortion components independent of the relative phase and/or gain adjustments to the signal components, the signal components on the first path 52 become independent of the signal components on the second path 54.

In previous configurations where the power of the signal components is distributed among first and second amplifier paths, equal power at the inputs to first and second amplifiers on the separate paths can be achieved by sampling the output of the first amplifier, rotating the phase of the sample and attenuatively adding the sample to the signal components on the second path to reduce the level of the signal components through what can be referred to as vector attenuation. As such, the signal components input to the second amplifier are dependent upon the output to the first amplifier.

The signal amplifier system 50 also distributes the power of the input signal components on the first and second amplifier paths 52 and 54, thereby enabling improved power efficiency. However, in accordance with principles of the present invention, the signal components on the first path 52 are independent from the signal components on the second path 54, for example by passively coupling and attenuating the signal components on the second path without vector attenuation. Because the signal components are removed from the coupling path 58, the signal components on the second path 54 provided to the second amplifier 66 (GainB) are independent of the signal components output from the amplifier 56 on the first path 52 in that the amplified signal components from the first amplifier 56 will not effect the signal components on the second path 54. Additionally, the loss of the first amplifier 56 (GainA) will not result in an undesired large increase in power level at the combined output of the amplifier system 50. Instead, about one half of the power of the signal components would be produced.

The adjusted distortion components on the coupling path 58 are provided to a coupler 98, such as a 10 dB directional coupler which attenuates the distortion components on the coupling path by about 10 dB and combines the distortion components from the coupling path 58 with the signal components on the second path 54. Before being provided to the coupler 98, the signal components from the coupler 78 are delayed by a delay 100 (DelayN) by an amount such that the distortion components on the coupling path 58 arrive at the coupler 98 at substantially the same time as the signal components corresponding to the distortion components. The signal components corresponding to the distortion components are the signal components which resulted in the distortion components when the signal components were amplified. An attenuator 102 adjusts the amplitude of the signal components on the second path 54 by a 3 dB reduction in this example. A phase delay 104, such as a 90 degree phase delay, delays the signal components on the second path 54 by 90 degrees to have a phase value of −90 degrees. The attenuator 102 and the phase delay 104 provide gain and phase adjustments to the signal components on the second path 54 without a corresponding change to the distortion components and thereby could be considered as part of an independent adjustment arrangement. The delay 100, the attenuator 102 and the phase delay 104 provide constant time, amplitude and phase adjustments to enable the different paths carrying components to be combined to match up in terms of time, gain and phase for improved combining given the components used in this embodiment.

The signal components on the second path 54 at −90 degrees and the adjusted distortion components on the coupling path 58 at 0 degrees are provided to the coupler 98. In this embodiment, the coupler 98 phase shifts the signal components on the second path 54 by 90 degrees to about −180 degrees and combines the signal components with the distortion components from the coupling path 58 at about 0 degrees onto the second path 54. As such, the signal components with phase values at about −180 degrees and the distortion components with phase values at about 0 degrees are provided onto the second path 54 in this embodiment. However, the 180 degree out of phase relationship and/or the amplitude difference between the signal components and the distortion components on the second path can be changed due to the independent adjusting of the phase and/or amplitude of the distortion components on the coupling path 58.

The signal components and the distortion components from the coupler 98 are provided to an attenuator 108 which adjusts the amplitude of the signal and distortion components. A phase shifter 110 shifts the phase of the signal and distortion components. The signal and distortion components are amplified by the amplifier 66, and the amplified signal and distortion components are combined at a coupler 112, such as a 3 dB coupler, with the corresponding signal and distortion components on the first path 52. The amplifier 66 amplifies the distortion components received from the second path 54 at about 0 degrees and generates distortion components at about −180 degrees from amplifying the signal components from the second path 54 which. are at −180 degrees. In this embodiment, the sampled distortion components from the amplifier 56 amplified by the amplifier 66 at about 0 degrees are reduced by the distortion components generated at the amplifier 66 at about −180 degrees from amplifying the signal components at −180 degrees, leaving distortion components at about zero degrees.

In this embodiment, the signal components at the input to the amplifier 66 should have the same amplitude as the signal components at the amplifier 56 with a phase value of −180 degrees. The signal and distortion components from the coupler 70, at phase values of −90 degrees are provided to a delay 114 (DelayB) which delays the signal components and the distortion components on the first path 52 such that the corresponding portions of the signal and distortion components on the first path 52 and the signal and distortion components on the second path 54 reach the coupler 112 at substantially the same time. The amplified signal and distortion components on the first path 52 are received by the coupler 112 which delays the signal and distortion components by 90 degrees to phase values of about −180 degrees. In producing the amplified signal components $RF_{out}$, the coupler 112 constructively combines the signal components from the first and second paths 52 and 54 in phase and at about the same amplitude such that the first and second paths 52 and 54 each provide one-half of the power to the signal components at the output of the system 50. Since the distortion components on the first and second paths 52 and 54 are at about 180 degrees out of phase, the distortion components on the first path 52 destructively combine with the distortion components on the second path 54 to reduce the distortion components at the output of the coupler 112.

To improve the constructive combining of the signal components from the first and second paths 52 and 54 at the coupler 112, the relative phase and/or amplitude between the signal components can be adjusted. For example, the gain and/or phase adjusters 108 and 110 can adjust the relative gain and/or phase between the signal components of the first and second paths 52 and 54. The gain and phase adjustments provided by the gain and phase adjusters 108 and 110 can be set by monitoring the combining of the relative signal components combining at the coupler 112. To do so, the isolated port of the coupler 112 can be monitored until a null is found. By monitoring the signal components at the output, for example at the isolated port of the coupler 112, the adjustments provided by the gain adjuster 108 and/or phase adjuster 110 can be set once, periodically (based on changing conditions or expiration of a time period), or dynamically (based on changing operating conditions or continuously) as described below. The relative gain and/or phase between the distortion components on the first and second paths 52 and 54 is also adjusted by the same amount.

The independent adjustment arrangement 60 enables the relative phase and/or gain between the distortion components on the first and second paths to be adjusted independent of the relative phase and/or gain adjustments between the signal components on the first and second paths. As such, the destructive combining of the distortion components from the first and second paths 52 and 54 at the coupler 112 can be improved by performing adjustments to the relative phase and/or gain of the distortion component on the coupling path 58. For example, the monitoring of the combining of the distortion components can be performed, and the gain and/or phase adjustments provided by the gain and phase adjusters 62 and 64 set accordingly. For example, by monitoring the distortion components at the output of the coupler 112, the adjustments provided by the gain adjuster 62 and/or phase adjuster 64 can be set once, periodically (based on changing conditions or expiration of a time period), or dynamically (based on changing operating conditions or continuously) as described below. By providing independent adjustment of the distortion components, the combining of the signal components can also be improved because the changes to the phase and/or gain of the signal components can be performed based on the combining of the signal components independent of the combining of the distortion components even though the gain and/or phase adjustments made to the signal components by the gain and phase adjusters 108 and 110 is also made to the distortion components.

Figure 3:
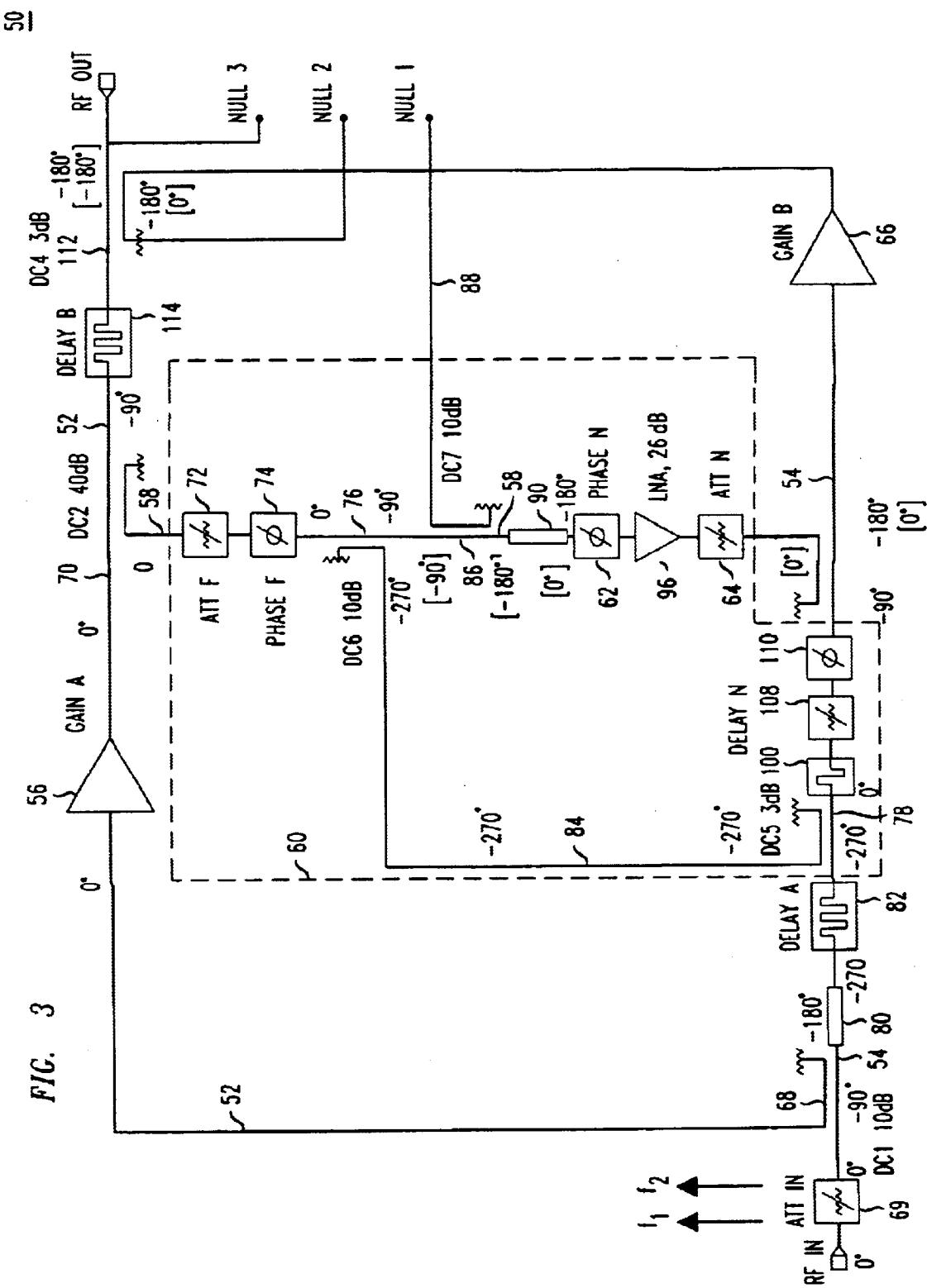
FIG. 3 shows another embodiment of an amplification system according to the principles of the present invention.

Alternatively, the power amplifier system can provide adjustable phase and/or amplitude adjustments to the signal components which do not result in a corresponding phase and/or amplitude adjustments to the distortion components to provide independent adjustment of the signal components. A gain adjuster and/or phase adjuster can be positioned on the second path 54 before the coupler 98 where only signal components are on the second path 54. As such, relative amplitude and/or phase adjustments can be performed between the signal components without a corresponding relative amplitude and/or phase adjustment between the distortion components. For example, as shown in FIG. 3, the gain adjuster 108 and/or the phase shifter 110 of FIG. 2 can be positioned where the attenuator 102 and/or the phase shifter 120 are on the second path 54. By moving the adjustable gain and/or phase adjusters 108 and/or 110 onto the second path 54 before the coupler 98, independent amplitude and/or phase adjustments between the signal and distortion components can be achieved by providing relative gain and/or phase adjustments to the signal components without corresponding gain and/or phase adjustments to the distortion components, thereby providing complete independence in the relative gain and/or phase adjustments to both the signal components and distortion components. Additionally, the gain adjuster 108 can compensate for the attenuation provided by the attenuator 102, and the phase shifter can provide the phase shift provided by the phase shifter 104. As such, the attenuator 102 and the phase shifter 104 can be removed, and the delay provided by the delay 114 can be reduced along with the gain of the LNA 96 due to the removal of the attenuator 102 and the phase shifter 104.

Figure 4:
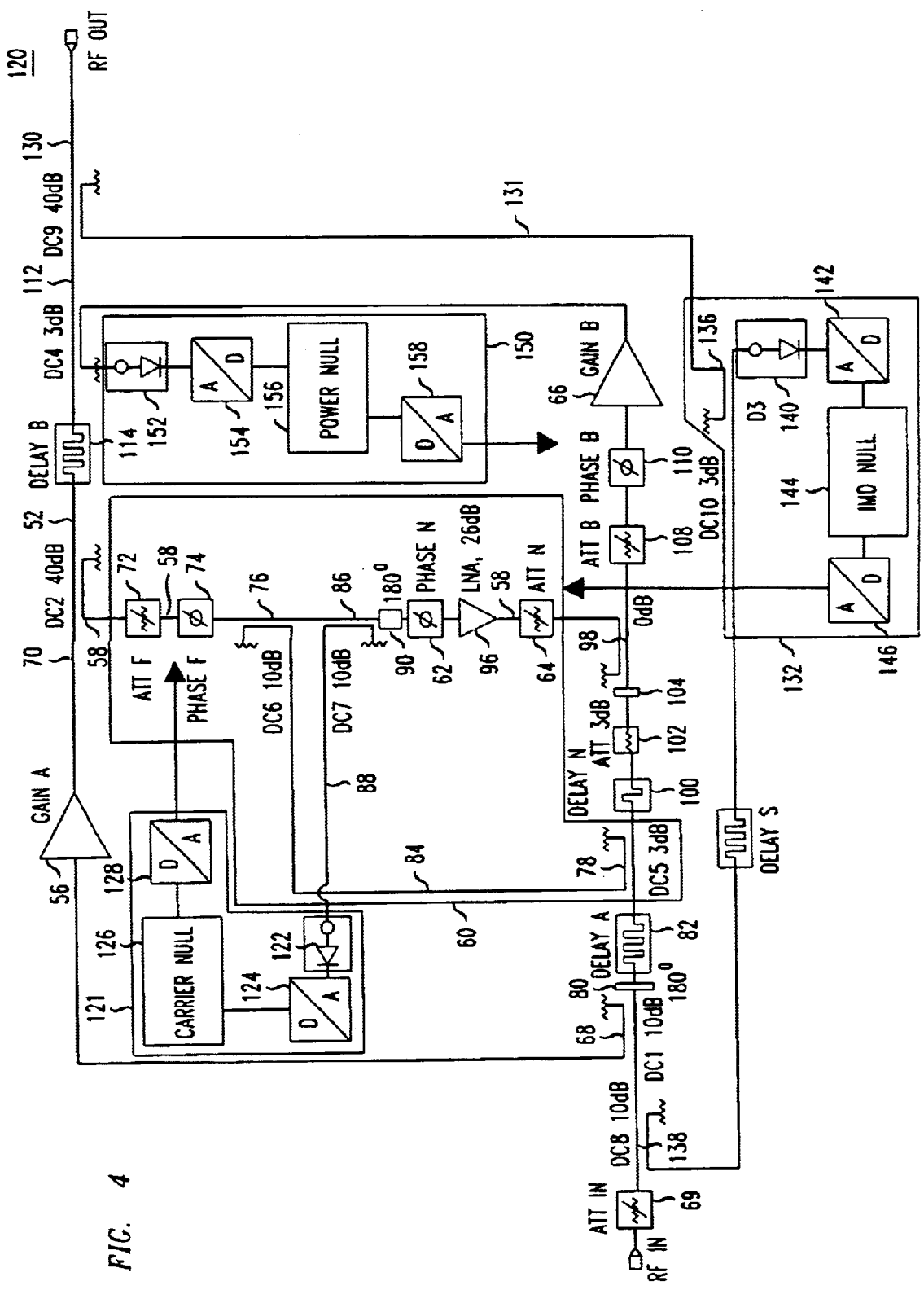
FIG. 4 shows an embodiment of the amplification system of FIG. 2 with dynamic control.

The independent adjustment of the relative gain and/or phase of the distortion components and/or the signal components can be performed once to align the power amplifier architecture on the production line, periodically (based on changing conditions or expiration of a time period), or dynamically (based on changing operating conditions or continuously). Because the constructive combination of the signal components can be made independent of the destructive combination of the distortion components, dynamic control to further improve the operation of the architecture 50 can be provided in a relatively simple manner. FIG. 4 shows an amplifier architecture 120 which uses dynamic control to improve the operation of the architecture 50 of FIG. 2. For example, the coupler 86 provides a signal representing the output of the coupler 76 which indicates how well the signal components have been removed from the coupling path 58 after being combined with the corresponding signal components from the cancellation path 84. The signal on the measurement path 88 is provided to signal cancellation circuitry 121 which provides gain and/or phase adjustment control signals to the gain and/or phase adjusters 72 and 74 to improve cancellation of the signal components at the coupler 76 in response to the signal on the measurement path 88. In this embodiment, the signal cancellation circuitry includes power detector circuitry 122, for example including a diode detector, and the detector 122 provides a signal, such as a power level signal, indicating how well the cancellation of the signal components has been achieved. The signal cancellation signal from the detector 122 is provided to an analog to digital (A/D) converter 124 which digitizes the signal cancellation signal, and the digitized cancellation signal is provided to control circuitry 126.

The control circuitry 126 monitors the signal cancellation signal and provides control signals to an digital to analog (D/A) converter 128 to adjust the gain and/or phase provided by the gain and phase adjusters 72 and 74 in response to the signal cancellation signal. The control circuitry 126 provides the control signals to find the gain and/or phase adjustments which produce a null in the cancellation signal which reflects good cancellation of the signal components on the coupling path 158. This control can be set during initial alignment, or dynamic control provided. Dynamic control is provided because during operation any changes in the signal cancellation signal indicating a degradation in the cancellation of the signal components on the coupling path 58 can be responded to with control signal to adjust the gain and/or phase to improve cancellation of the signal components.

By achieving improved cancellation of the signal components on the coupling path 58, the distortion components can be isolated on the coupling path, and the distortion components can be independently adjusted to improve the cancellation of the distortion components at the output of the coupler 112. By providing independent adjustment of the distortion components, independent control of the combination of the distortion components is possible, and dynamic control of the cancellation of the distortion components can be readily achieved. In this embodiment, a coupler 130 couples a replica of the output signal RFout onto a distortion cancellation path 131 and provides the signal to distortion cancellation control circuitry 132 which provides gain and/or phase adjustment control signals to gain and/or phase adjusters 62 and 64 in response to the coupled output signal. In this embodiment, the signal on the distortion cancellation path 131 is provided to a coupler 136 which combines the signal on the signal cancellation path 131 with a delayed version of the signal components coupled from a coupler 138 at the input of the architecture 120. The signal components from the coupler 138 are delayed such that the corresponding portions of the signal components arrive at the coupler 136 at substantially the same time. The corresponding signal components should be about 180 degrees out of phase such that the signal components are reduced and the distortion components from the signal on the distortion cancellation path 131 can be detected by detection circuitry 140, for example including a diode detector.

The detection circuitry 140 provides a distortion cancellation signal indicating the level of the distortion components remaining on the output of the coupler 112, thereby indicating the level of the cancellation of the distortion components at the coupler 112. The distortion cancellation signal is provided to an A/D converter 142 which digitizes the distortion cancellation signal. The digitized distortion cancellation signal is provided to control circuitry 144. The control circuitry 144 monitors the distortion cancellation signal and provides control signals to a digital to analog (D/A) converter 146 to adjust the gain and/or phase provided by the gain and phase adjusters 62 and 64 in response to the distortion cancellation signal. The control circuitry 144 provides the control signals to find the gain and/or phase adjustments which produce a null in the distortion cancellation signal which reflects good cancellation of the distortion components at the coupler 112. This control can be set during initial alignment, or dynamic control provided. Dynamic control is provided because, during operation, any changes in the distortion cancellation signal indicating a degradation in the cancellation of the distortion components at the coupler 112 can be responded to with control signals to adjust the gain and/or phase to improve cancellation of the distortion components.

By providing independent adjustment of the distortion components, independent control of the constructive combination of the signal components at the coupler 112 is possible whereby gain and/or phase adjustments are made to the signal components (alone or together with the distortion components depending on the embodiment) depending on how the constructive combination of the signal components is performed. Dynamic control of the constructive combination of the signal components can be readily achieved. In this embodiment, a signal combination signal indicative of how well the signal components are combining in the coupler 112, for example a signal on the isolated port of the coupler 112, is provided to signal combination control circuitry 150 which provides gain and/or phase adjustment control signals to gain and/or phase adjusters 108 and 110 in response to the signal combination signal.

In this embodiment, the signal combination control circuitry 150 includes detection circuitry 152, for example including a diode detector, which detects the signal combination signal and provides a combination signal indicating how well the signal components combined in the coupler 112. The combination signal is provided to an A/D converter 154 which digitizes the combination signal, and the digitized combination signal is provided to control circuitry 156. The control circuitry 156 monitors the combination signal and provides control signals to a digital to analog (D/A) converter 158 to adjust the gain and/or phase provided by the gain and phase adjusters 108 and 110 in response to the signal combination signal. The control circuitry 156 provides the control signals to find the gain and/or phase adjustments which produce a null in the combination signal which reflects good constructive combination of the signal components at the coupler 112. This control can be set during initial alignment, or dynamic control provided. Dynamic control is provided because, during operation, any changes in the signal combination signal indicating a degradation in the combination of the signal components at the coupler 112 can be responded to with control signals to adjust the gain and/or phase to improve constructive combination of the signal components.

Figure 5:
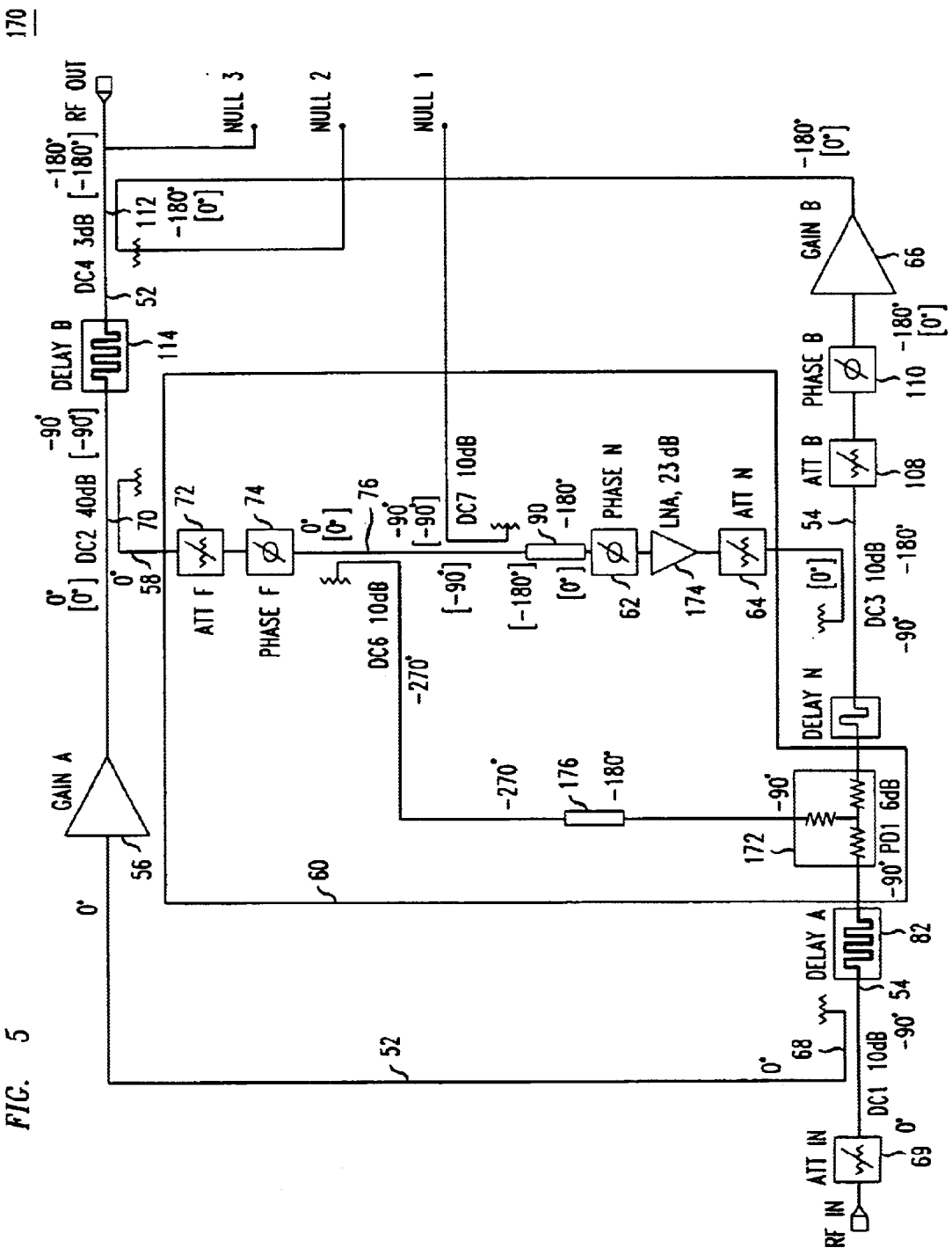
FIG. 5 shows an alternative embodiment of the signal amplification system according to the principles of the present invention.

In addition to the embodiment described above, alternative configurations of the amplification system and method according to the principles of the present invention are possible which omit and/or add components and/or use variations or portions of the described system. For example, FIG. 5 shows a signal amplification system 170 in which like reference numerals indicate corresponding components in the architecture 170 as in the above amplifier systems. In the system 170, the replica of the signal components on the second path 54 from the coupler 68 are provided directly into the delay 82 (DelayA). The 180 degree phase shifter 80 of FIGS. 2 and 4 is not used because a power divider 172 on the second path 54 replaces the coupler 78 in the FIGS. 2 and 4 of the independent adjustment arrangement 60. The power divider 172 receives the signal components on the second path 54 and divides the signal components into replicas of the signal components on the coupling path 84 and the second path 54 which are both attenuated by 6 dB. The power divider 172 does not introduce a phase shift to signal components on the coupling path 84 and the second path 54. Accordingly, using a power divider 172 can reduce the number of phase shifters and attenuators.

For example, by using the power divider 172, the 180 degree phase shifter 80 and the 90 degree phase shifter 104 of FIGS. 2 and 4 are not used, and the 3 dB attenuator 102 of FIGS. 2 and 4 is not used. The LNA 96 of FIGS. 2 and 4 which provides 26 dB of gain is replaced with a LNA 174 which provides 23 dB of gain in this embodiment. Additionally, a 180 degree phase shifter 176 is placed on the cancellation path 84 to provide the signal components from the power divider 172 at phase values of −270 degrees for cancellation of the signal components on the coupling path 58 at the coupler 76. The phase shifts to the signal components on the paths are shown along with the phase shifts of the distortion components in brackets.

The delays, gains, attenuations or phase shifts for the signal components and/or the distortion components used in the amplifier system can be determined by the components available and the operation described above where separate paths carrying corresponding frequency components to be combined in a desired fashion are matched or designed in terms of delay, gain and phase shift to provide the desired combination. Depending on the embodiment, a variety of different components or methods can be used to cancel and/or combine signal and/or distortion components to provide independent adjusting of the phase and/or amplitude of signal and/or distortion components when combining corresponding signal and distortion components to produce amplified signal components according to the principles of the present invention. Ideal destructive and/or constructive combination of components is not required. For example, a phase difference of 170–190 degrees and an amplitude difference of 1 dB between the destructively combining frequency components can provide sufficient cancellation, or a phase difference of 10 degrees and an amplitude difference of 1 dB between constructively combining signals can be sufficient. Depending on the application, different relative phase and/or amplitude differences between combining components can be acceptable.

Additionally, the embodiments of the amplification system and method have been described as a method or system for amplifying signal components in a linear fashion. The amplification system can be used in conjunction with other distortion reduction or amplifier linearization techniques to provide improved efficiency and/or linear performance in providing a signal after amplification. Moreover, the amplification system has been described as amplifying signal components, but the amplification system can be used to amplify single, changing, modulated (for example, using phase shift keying (PSK), such as QPSK and frequency shift keying (FSK)), multiple combined signals, multiple signals and separate signals. The amplification system has been described with certain delays, phase shifters, couplers, combiners, control circuitry and/or power combiners, but other components and arrangements of components or filters with different responses are possible which perform the described or other combinations and/or cancellations. For example, each amplifier 56 or 66 can be n-paralleled amplifier stages. The system has been described as using parallel-line couplers, but other devices, such as 3 dB splitters and other coupling, signal splitting or sampling devices, can be used as well as other combining devices, such as summers.

Depending on the application, the gain and/or phase circuitry and/or shifters can be positioned in different locations and/or paths within the described embodiments, such as before the amplifier 56 or the gain and/or phase shifters 72 and/or 74 moved onto the cancellation path 84. The amplification system has been further described as using different configurations of discrete components, but it should be understood that the various embodiments and portions thereof can be implemented using different arrangements of components and functions using application specific integrated circuits, software-driven processing circuitry, firmware, programmable logic devices, hardware or other arrangements of discrete components as would be understood by one of ordinary skill in the art with the benefit of this disclosure. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of producing amplified signal components, said method comprising:

splitting signal components onto a first path and a second path;

amplifying said signal components on said first path to produce distortion components on said first path;

splitting said signal components amplified on said first path and said distortion components on said first path onto said first path and said coupling path;

isolating distortion components on said coupling path;

independently adjusting at least one of the phase and amplitude of said distortion components on said coupling path;

combining onto said second path said signal components on said second path with said distortion components adjusted on said coupling path;

amplifying said signal components and said distortion components on said second path; and combining said signal components and said distortion components on said second path with said signal components and said distortion components on said first path to produce said amplified signal components.

2. The method of claim 1 wherein said independently adjusting including:

adjusting at least one of the phase and amplitude of at least one of the distortion components without a corresponding adjustment in the signal components.

3. The method of claim 1 wherein said isolating includes:

splitting said signal components on said second path into signal components on said second path and signal components on a cancellation path; and combining said signal components on said cancellation path with said signal components and said distortion components on said coupling path to reduce said signal components on said coupling path.

4. A signal amplification system comprising:

a splitting device configured to receive signal components and provide said signal components onto a first path and a second path;

a first amplifier on said first path configured to amplify said signal components on said first path to produce distortion components on said first path;

a second splitting device configured to provide said signal components amplified on said first path and said distortion components on said first path onto said first path and said coupling path;

an independent adjustment arrangement configured to isolate distortion components on said coupling path and to independently adjust at least one of the phase and amplitude of said distortion components isolated on said coupling path;

a second combining device configured to provide said signal components on said second path with said distortion components adjusted on said coupling path onto said second path;

a second amplifier on said second path configured to amplify said signal components and said distortion components on said second path; and a combining device configured to combine said signal components and said distortion components on said second path with said signal components and said distortion components on said first path.

5. The signal amplification system of claim 4 wherein said independent adjustment arrangement is configured to adjust at least one of the phase and amplitude of the distortion components without a corresponding adjustment in the signal components.

6. The system of claim 4 wherein said independent adjustment arrangement includes:

a third splitting device on said second path configured to split said signal components on said second path into signal components on said second path and signal components on a cancellation path; and a third combining device on said coupling path configured to combine said signal components on said cancellation path with said signal components and said distortion components on said coupling path to reduce said signal components on said coupling path.

* * * * *